(12) United States Patent
Zickar

(10) Patent No.: US 11,739,847 B2
(45) Date of Patent: Aug. 29, 2023

(54) ADVANCED VACUUM PROCESS CONTROL

(71) Applicant: VAT HOLDING AG, Haag (CH)

(72) Inventor: Michael Zickar, Engelburg (CH)

(73) Assignee: VAT HOLDING AG, Haag (CH)

( * ) Notice: Subject to any disclaimer, the term of this patent is extended or adjusted under 35 U.S.C. 154(b) by 302 days.

(21) Appl. No.: 16/760,864

(22) PCT Filed: Oct. 17, 2018

(86) PCT No.: PCT/EP2018/078339
§ 371 (c)(1),
(2) Date: Apr. 30, 2020

(87) PCT Pub. No.: WO2019/086245
PCT Pub. Date: May 9, 2019

(65) Prior Publication Data
US 2021/0180700 A1 Jun. 17, 2021

(30) Foreign Application Priority Data
Oct. 30, 2017 (EP) ..................................... 17199112

(51) Int. Cl.
*F16K 3/06* (2006.01)
*F16K 37/00* (2006.01)
*F16K 51/02* (2006.01)
*H01L 21/67* (2006.01)
(52) U.S. Cl.
CPC .............. *F16K 3/06* (2013.01); *F16K 37/005* (2013.01); *F16K 51/02* (2013.01); *H01L 21/67017* (2013.01)

(58) Field of Classification Search
CPC F16K 3/06; F16K 51/02; G05B 11/42; G05B 19/4142
See application file for complete search history.

(56) References Cited

U.S. PATENT DOCUMENTS 3,145,969 A 8/1964 Von Zweck
5,577,707 A 11/1996 Brida
6,041,814 A 3/2000 Koketsu et al.
(Continued)

FOREIGN PATENT DOCUMENTS

CN 1969241 A 5/2007
CN 101208551 A 6/2008
(Continued)

*Primary Examiner* — Reinaldo Sanchez-Medina
*Assistant Examiner* — Nicole Gardner
(74) *Attorney, Agent, or Firm* — Muncy, Geissler, Olds & Lowe, P.C.

(57) ABSTRACT

The invention relates to a vacuum process system for an evacuable vacuum process volume, a vacuum valve, a peripheral unit having a closed-loop and open-loop control unit. The vacuum valve includes a valve seat, with a valve opening and a first sealing surface; a valve closure, with a second sealing surface and a drive unit coupled to the valve closure. The valve closure can be varied to provide different valve opening states. The closed-loop and open-loop control unit can perform multiple execution of a process cycle with control of the peripheral unit at least in part to execute a control cycle providing a deliberate variation or setting of the valve opening state by controlling the drive unit on the basis of a currently determined controlled variable for a process parameter and on the basis of a target variable and can be performed with a certain temporal relation.

22 Claims, 3 Drawing Sheets

(56) References Cited

U.S. PATENT DOCUMENTS

| | | |
|---|---|---|
| 6,056,266 A | 5/2000 | Blecha |
| 6,089,537 A | 7/2000 | Olmsted |
| 6,416,037 B1 | 7/2002 | Geiser |
| 6,629,682 B2 | 10/2003 | Duelli |
| 7,381,650 B2 | 6/2008 | Johnson et al. |
| 7,396,001 B2 | 7/2008 | Geiser |
| 8,078,552 B2 | 12/2011 | Kaushal et al. |
| 2003/0011136 A1 | 1/2003 | Ramirez |
| 2005/0067603 A1 | 3/2005 | Lucas et al. |
| 2010/0264117 A1 | 10/2010 | Ohmi et al. |

FOREIGN PATENT DOCUMENTS

| | | |
|---|---|---|
| CN | 101320275 A | 12/2008 |
| CN | 201330858 Y | 10/2009 |
| CN | 101109451 A | 2/2012 |
| DE | 1264191 B1 | 1/1963 |
| DE | 7731993 U1 | 10/1977 |
| DE | 3447008 C2 | 12/1984 |
| JP | H09-72458 A | 3/1997 |
| JP | 2007-170662 A | 7/2007 |
| JP | 2008-544546 A | 12/2008 |
| JP | 2011-517806 A | 6/2011 |
| WO | 2009057583 A | 3/2011 |
| WO | 2015189263 A1 | 12/2015 |

ADVANCED VACUUM PROCESS CONTROL

This application is a 371 National Phase of PCT Application No. PCT/EP2018/078339, filed on Oct. 17, 2018; which claims priority to European Patent application 17199112.8 filed Oct. 30, 2017 and each of which is herein incorporated by reference in its entirety.

The invention relates to a system consisting of a vacuum valve, a process chamber, a peripheral unit and a control and regulating unit for the controlled ("gesteuert") and regulated ("geregelt") operation of a processing process under vacuum conditions.

Vacuum valves for regulating a volume or mass flow and for essentially gas-tight closing of a flow path leading through an opening formed in a valve housing are generally known from the prior art in various embodiments and are used in particular for vacuum chamber systems in the area of IC, semiconductor or substrate production, which must take place in a protected atmosphere without the presence of contaminating particles, if possible. Such vacuum chamber systems comprise in particular at least one vacuum chamber which can be evacuated and is provided for receiving semiconductor elements or substrates to be processed or produced and which has at least one vacuum chamber opening through which the semiconductor elements or other substrates can be guided into and out of the vacuum chamber, and at least one vacuum pump for evacuating the vacuum chamber. For example, in a production plant for semiconductor wafers or liquid crystal substrates, the highly sensitive semiconductor or liquid crystal elements pass sequentially through several process vacuum chambers in which the parts located within the process vacuum chambers are each processed by means of a processing device. Both during the processing process within the process vacuum chambers and during the transport from chamber to chamber, the highly sensitive semiconductor elements or substrates must always be in a protected atmosphere—especially in an airless environment.

For this purpose, peripheral valves are used to open and close a gas inlet or outlet on the one hand and transfer valves are used on the other hand to open and close the transfer openings of the vacuum chambers for inserting and removing the parts.

The vacuum valves through which semiconductor parts pass are referred to as vacuum transfer valves due to the area of application described and the associated dimensioning, also as rectangular valves due to their mainly rectangular opening cross-section, and also as slide valves, rectangular sliders or transfer slide valves due to their normal mode of operation.

Peripheral valves are used in particular for the control ("Steuerung") or regulation ("Regelung") of the gas flow between a vacuum chamber and a vacuum pump or a further vacuum chamber. For example, peripheral valves are located within a pipe system between a process vacuum chamber or a transfer chamber and a vacuum pump, the atmosphere or a further process vacuum chamber. The opening cross-section of such valves, also known as pump valves, is generally smaller than that of a vacuum transfer valve. Peripheral valves are also called regulating valves because, depending on the field of application, they are used not only to completely open and close an opening, but also to control or regulate a flow by continuously adjusting the opening cross-section between a fully open position and a gas-tight closed position. A possible peripheral valve for controlling or regulating the gas flow is the pendulum valve.

In a typical pendulum valve, such as the one known from U.S. Pat. No. 6,089,537 (Olmsted), the first step is to rotate a normally round valve disk from a position that releases the opening to an intermediate position that covers the opening via an opening that is usually also round. In the case of a slide valve, as described for example in U.S. Pat. No. 6,416,037 (Geiser) or U.S. Pat. No. 6,056,266 (Blecha), the valve disk, as well as the opening, is usually rectangular and in this first step is pushed linearly from a position releasing the opening into an intermediate position covering the opening. In this intermediate position, the valve disk of the pendulum or slide valve is located at a distance opposite the valve seat surrounding the opening. In a second step, the distance between the valve disk and the valve seat is reduced so that the valve disk and the valve seat are pressed evenly against each other and the opening is closed essentially gas-tight. This second movement preferably occurs in a direction substantially perpendicular to the valve seat. The sealing can, for example, take place either via a sealing ring arranged on the closing side of the valve disk, which is pressed onto the valve seat surrounding the opening, or via a sealing ring on the valve seat, against which the closing side of the valve disk is pressed. Due to the two-step closing process, the sealing ring between the valve disk and the valve seat is subjected to hardly any shear forces that would destroy the sealing ring, as the movement of the valve disk in the second step takes place essentially in a straight line perpendicular to the valve seat.

Various sealing devices are known from the prior art, for example from the U.S. Pat. No. 6,629,682 B2 (Duelli). A suitable material for sealing rings and seals in vacuum valves is, for example, fluororubber, also known as FKM, in particular the fluoroelastomer known under the trade name "Viton", and perfluororubber, FFKM for short.

From the state of the art, different actuator systems are known to achieve this combination of a rotational and a translational movement of the valve disk parallel to the opening of the pendulum valve and a substantially translational movement perpendicular to the opening of the slide valve, for example from U.S. Pat. No. 6,089,537 (Olmsted) for a pendulum valve and from U.S. Pat. No. 6,416,037 (Geiser) for a slide valve.

The valve disk must be pressed against the valve seat in such a way that both the required gas tightness within the entire pressure range is ensured and damage to the sealing medium, in particular the sealing ring in the form of an O-ring, caused by excessive pressure loading is avoided. In order to guarantee this, well-known valves provide for pressure control of the valve disk as a function of the pressure difference between the two valve disk sides. Especially with large pressure fluctuations or the change from negative pressure to positive pressure, or vice versa, an even force distribution along the entire circumference of the sealing ring cannot always be guaranteed. In general, the aim is to decouple the sealing ring from support forces resulting from the pressure applied to the valve. In U.S. Pat. No. 6,629,682 (Duelli), for example, a vacuum valve with a sealing medium is proposed, which consists of a sealing ring and an adjacent support ring, so that the sealing ring is essentially free of support forces.

In order to achieve the required gas tightness, optionally for both positive and negative pressures, some known pendulum valves or slide valves provide additionally or alternatively to the second movement step a valve ring which can be displaced perpendicular to the valve disk, surrounds the opening and is pressed onto the valve disk to close the valve gas-tight. Such valves with valve rings that can be actively displaced relative to the valve disk are known, for example, from DE 1 264 191 B1, DE 34 47 008 C2, U.S. Pat. No. 3,145,969 (von Zweck) and DE 77 31 993 U. U.S. Pat. No. 5,577,707 (Brida) describes a pendulum valve with valve body having an opening and a valve disk that can be pivoted parallel across the opening to control flow through the opening. A valve ring which surrounds the opening can be actively moved vertically in the direction of the valve disk by means of several springs and compressed air cylinders. A possible further development of this pendulum valve is proposed in US 2005/0067603 A1 (Lucas et al.).

Since the above-mentioned valves are used, among other things, in the manufacture of highly sensitive semiconductor elements, the particle generation caused in particular by the actuation of the valve and by the mechanical load on the valve closure element and the number of free particles in the valve chamber must be kept as low as possible. Particle generation is primarily a result of friction, for example through metal-to-metal contact and abrasion.

As described above, vacuum regulating valves are used to set a defined process environment in a process chamber. The regulation is typically performed by means of a pressure signal, which provides information about the internal chamber pressure, and by means of a target variable, i.e. a target pressure, which is to be achieved by means of the regulation. The position of a valve closure (valve disk) is then varied within the regulation so that the target pressure is reached within a certain period of time.

As an alternative to regulation, vacuum regulating valves can also be operated in a controlled manner using known process parameters, such as a target pressure to be reached in the process chamber within a specified time. For this purpose, the relevant target positions are provided, for example, for the valve disk and this position is approached at specified times.

Both of the above methods have their specific advantages and disadvantages. For example, a pre-defined control can be used to set a target pressure in the process chamber in a relatively short time, but due to a typical lack of feedback (e.g. current pressure information) a statement about the actual pressure can only be made with reservations. Any undesirable influences on the production process, such as a changed gas inlet or a leak in the process chamber, remain completely undetected and typically lead to a reduction in production quality.

In contrast to control, the regulation of the pressure in a process chamber is more time-consuming. A feedback signal—typically generated by a pressure sensor that measures the current chamber pressure—is detected and processed with a natural delay. A regulation based on this therefore takes place with a corresponding delay and leads to a corresponding later adjustment of the target pressure. On the other hand, the regulation of the target pressure can reliably adjust it even with varying gas inlets or pressure fluctuations in the process chamber. Due to the more reliable process security with regard to the decisive internal chamber pressure, regulation of the valve is preferred in most cases.

In addition, a typical processing process consists of a series of individual steps—loading the chamber, closing the chamber, evacuating and filling the chamber with process gas, etc. These steps also include in particular the setting of a target pressure or desired mass flow in the chamber by means of the vacuum valve. Due to the typically decentralized coordination of the individual steps, controls for such processes are complex, error-prone and subject to certain time delays between individual steps. For example, a regulating valve receives a signal when to start pressure regulation. Once the target pressure has been reached, a signal for the subsequent process step must be output again.

The invention is thus based on the object of providing an improved vacuum process which is able to overcome the disadvantages mentioned above.

In particular, it is the object of the invention to provide an improved vacuum process which has an improved, i.e. faster, more reliable and simpler, processing of objects.

These objects are achieved by the realization of the characterizing features of the independent claims. Features which further develop the invention in an alternative or advantageous way can be found in the dependent patent claims.

The basic idea of the present invention is to control or regulate the vacuum valve for such a processing system no longer in isolation, i.e. the control of the valve no longer receives only a signal to start the pressure setting, but a control and regulating unit for the system not only regulates the valve but actively controls at least one further step and thus another component of the processing process. Such central control and regulation of several components can result in improved coordination of individual process steps. For example, a start of pressure regulation can be optimally synchronized with the actuation of a gas inlet valve, thus providing faster adjustment to a desired target pressure. Alternatively, the regulator can recognize when the target pressure is expected to be reached and can activate a peripheral unit—such as an electrode for plasma generation—accordingly in a time-optimized manner. This can also save a considerable amount of time.

If a process cycle is repeated several times, further advantages of the system can be exploited. On the part of the vacuum valve and its regulation, for example, information can be generated that allows a statement to be made about the state of the process. For example, a currently recorded regulating curve can be compared with a stored regulating curve and a controlled adjustment of the process can be carried out on the basis of possible deviations of these two curves. For this purpose, for example, a gas inlet can be reduced in a controlled manner in a next cycle. A regulating time that is too long, for example, may indicate that the amount of gas previously admitted was too large.

The invention thus relates to a vacuum process system for the defined processing of an object under vacuum conditions. The system has a vacuum process volume which can be evacuated and into which the object can be introduced for processing, a vacuum valve for regulating a volume or mass flow from the vacuum process volume and/or for gas-tight closure of the vacuum process volume, a peripheral unit designed for at least partial provision of a defined process state in the vacuum process volume, and a regulating and control unit. The partial provision of a defined process state is to be understood in such a way that at least one of the process-determining variables (e.g. chamber pressure or type of process gas) can be provided.

The vacuum process volume is, for example, a process chamber which can be closed gas-tight as required and into which the object can be inserted and removed, e.g. by means of a robot. The object can, for example, be a substrate to be coated or a wafer (semiconductor wafer).

The peripheral unit can be formed by various components which can be actuated and are provided for a processing process. In particular, a gas inlet unit (e.g. gas inlet valve or evaporator), a plasma device for generating the plasma or a transfer valve can form the peripheral unit. A pin lifter can also be considered as such a peripheral unit.

The vacuum valve has a valve seat which has a valve opening defining an opening axis and a first sealing surface surrounding the valve opening. In addition, a valve closure is provided for essentially gas-tight sealing of the valve opening with a second sealing surface corresponding to the first sealing surface. The valve also has a drive unit which is coupled to the valve closure and is designed in such a way that the valve closure can be varied and adjusted in a defined manner to provide a respective valve-opening state and is adjustable from an open position, in which the valve closure at least partially releases the valve opening, to a closed position, in which the first sealing surface is pressed against the second sealing surface and closes the valve opening in a substantially gas-tight manner, and back again.

The control and regulating unit is designed for multiple execution of a process cycle. The process cycle comprises at least one actuation of the peripheral unit such that at least part of the defined process state (e.g. defined process gas) can be provided, and execution of a regulation cycle providing a specific variation or setting of the valve opening state by actuation of the drive unit based on a currently determined regulation variable for a process parameter and based on a target variable, in particular as a result of which the regulation variable can be approximated to the target variable by a change in state of the valve closure brought about in this way.

The actuation of the peripheral unit and the execution of the regulation cycle can be carried out and controlled within the framework of the process cycle with a certain time relation.

The two steps of actuating the peripheral unit and regulating by means of the valve can thus be initiated or carried out with timing, i.e. with a known and predetermined time offset or synchronously. The time offset depends on the process state to be achieved (e.g. specific, constant internal pressure or laminar flow).

A synchronization of regulated chamber pressure by pumping off with variable valve adjustment and gas injection by means of an evaporation system for example allows the provision of a uniform pressure or flow and a comparatively fast evacuation of the volume, e.g. after a process step has been carried out and before a subsequent step has been initiated.

Furthermore, desired gas quantities can be provided for the deposition of atomic layers (ADL: Atomic Layer Deposition) or the etching of surfaces (ALE: Atomic Layer Etching). Typically, exactly defined process times in the range of a few milliseconds must be adhered to. A multiple repetition of such steps with identical sequence can be required for specific productions. It can be decisive in this case that process times are maintained precisely in each case, so that the number of applied atomic layers or single atoms for example can be kept constant and not too few or too many layers or atoms are deposited. The system according to the invention is able to control these processes in an improved way, since both the supply of the required process gases can be controlled by means of the peripheral unit (e.g. evaporator) and the adjustment of the required chamber pressure can be regulated.

A regulation (closed-loop control) can therefore be advantageous, as it avoids drift effects for possible system errors in contrast to an open-loop control.

Additional monitoring units, such as a pressure sensor, can be used to set or optimize the timing of the peripheral unit and vacuum valve.

In one embodiment, the regulating and control unit is designed for multiple execution of the process cycle, with an execution of a peripheral unit regulating cycle providing a targeted variation or setting of the peripheral unit by the said actuation of the peripheral unit based on a currently determined peripheral unit regulating variable for a peripheral unit process parameter and based on a peripheral unit target variable, wherein the execution of the regulating cycle and the execution of the peripheral unit regulating cycle can be carried out within the framework of the process cycle with a certain temporal relation.

This means that the actuation of the peripheral unit can be based on a regulation carried out by the regulating and control unit. In addition to the variation/setting of the valve opening state, the regulating and control unit can also vary/set a state of the peripheral unit, i.e. the peripheral unit can be regulated.

For example, a process gas supply unit can be regulated as a peripheral unit so that not only on demand a predetermined value or a predetermined value curve for the process gas supply (i.e. e.g. mass flow) is set as a peripheral unit process parameter, but that the process gas supply assumes a course which is influenced by feedback and thus contributes more effectively and/or efficiently to achieving the currently desired peripheral unit state. Another example of a regulated peripheral unit is a vacuum pump, wherein the pump output or the speed for example can be regulated in this case for example. Thus, the regulating and control unit can also regulate one or more states of various peripheral units by actuating those peripheral units.

By jointly regulating several system components, e.g. the vacuum valve and the process gas supply unit, a significant optimization of a processing process can be achieved with regard to the time required to reach a desired processing state (e.g. pressure and process gas quantity in the process volume). The process steps can thus be carried out with a higher sequence frequency.

In another embodiment, one or more peripheral unit process parameters can be taken into account in the regulating cycle. In addition or alternatively, one or more process parameters can also be considered in the peripheral unit regulating cycle.

This means that the flow of information in the respective regulating cycle is bilateral, whereby a better efficiency of the process cycle can be achieved again. The regulation of the drive unit can therefore consider parameters of the peripheral unit as feedback parameters, and conversely the regulation of the peripheral unit can also depend on parameters of the vacuum valve.

For example, when regulating a mass flow control unit (i.e. in the broader sense of a process gas supply unit as a peripheral unit), it is possible to take into account how a disk position of the vacuum valve, an opening of the vacuum valve, or a progression curve of the disk position of the vacuum valve is currently determined. The information from the vacuum valve can then be used, for example, to vary/set an inlet time and/or the flow rate of the process gas. Also, when regulating the vacuum pump, its performance can be regulated depending on the above or other information available through the vacuum valve.

On the other hand, when regulating the vacuum valve, for example, information about the gas supply can be taken into account, such as the current pressure measured by a process gas supply unit and/or the current temperature of the gas flowing through. When regulating the vacuum valve, the current speed or temperature of the vacuum pump can also be taken into account. As an example, a voltage value or a frequency value of a plasma generation can also be taken into account when regulating the vacuum valve.

In another embodiment, the regulating and control unit is comprised of the vacuum valve or the peripheral unit. This means that the regulating and control unit can be integrated as a physical component in the vacuum valve or in the peripheral unit.

In another embodiment, the peripheral unit has a peripheral unit control unit. Such a peripheral unit control unit may, for example, be available to control the peripheral unit. Especially in this embodiment, the peripheral unit control unit can now be designed in such a way that the regulating and control unit is embodied by the peripheral unit control unit. This means in particular that the peripheral unit control unit functionally assumes the role of the regulating and control unit, i.e. it is designed to control and/or regulate the peripheral unit, but also to regulate the vacuum valve.

The regulating and control unit can therefore also be formed in integrated design with one of the peripheral units, i.e. the regulating and control unit is provided by and with the corresponding peripheral unit(s) and the vacuum valve to be regulated is connected to the regulating and control unit.

In one embodiment, the regulating and control unit has an update functionality, in particular an update functionality that spans process cycles, which is designed in such a way that during its execution during a first process cycle process information is derived and a subsequent second process cycle is adapted on the basis of the process information. The process information can, for example, be a deviation from a defined normal state for the process, for example an excessive increase in pressure during aeration with process gas. The process information can be extracted from the respective regulating behavior of the valve. As a consequence, a valve for the gas inlet can be controlled during a subsequent process cycle in such a way that the pressure rise does not exceed a target level.

A previously occurring deviation in the process cycle can thus be reduced or completely avoided in a next cycle.

The regulating and control unit can also be configured in such a way that the update functionality can be executed continuously, in particular over a large number of control cycles during a production process.

The process information can be generated depending on the value of the derived regulation deviation, in particular wherein the process information is generated if the regulation deviation exceeds a predefined threshold value.

The process information may also include an output signal, wherein the output signal is generated acoustically or visually. In addition, the process information may contain quality information indicating a quality for the regulating cycle and this quality information may be used to generate a user output, in particular error information or an alarm signal.

Based on the process information, an undesired process state can also be identified, in particular an undesired mass inflow during the regulating cycle, wherein the existence of a process volume leak can be identified in particular.

In particular, by recording the regulating variable during execution of the first process cycle, an actual regulating curve can be derived as process information, the actual regulating curve can be compared with a stored reference regulating curve and a regulation deviation (extended process information) can be derived, and the adjustment of the second process cycle takes place based on a characteristic of the derived regulation deviation. For the second process cycle, for example, a pre-regulation position for the valve closure that can be approached in a controlled manner can be adapted or a start time for the gas inlet can be corrected.

A pre-regulating position can be approached by dividing the regulating cycle into two partial steps. In a first partial step, the valve closure is brought into this position, controlled according to a known setting, which ideally already lies close to a position to be set by pure regulation. In a second partial step, the internal chamber pressure is purely adjusted. By directly approaching the pre-regulating position, a delay that can result from the delayed information of the pressure sensor can be bridged and reduced.

In one embodiment, the process information can be derived by recording the regulating variable during the execution of the first process cycle and, based on the process information, the actuation of the peripheral unit can be adapted for the second process cycle. From information on the process state that can be derived by current regulation of the valve, the process, i.e. a subsequent process cycle, can thus be adapted to the target specifications by directly actuating the peripheral unit, i.e. without having to make any changes to the regulating parameters for regulating the valve. The valve regulation can therefore also be used here to check and monitor the process.

An actuation of the peripheral unit adapted on the basis of a preceding cycle can be provided and/or stored as a (new) current actuation for the process cycle, in particular wherein the adjustment of the actuation of the peripheral unit is adapted on the basis of an at least partially predictable effect on the regulating variable. This provides an iterative adaptation of the process cycle.

In particular, the second process cycle is carried out after the first process cycle.

In one embodiment, the regulating and control unit may be designed in such a way that the reference regulating curve can be generated and stored by recording the regulating variable during the execution of a plurality of regulating cycles, in particular wherein the regulating variables recorded for a specific time interval or for a specific point in time of the regulating step are averaged. This can be understood as a kind of learning function for the regulation and allows the generation of a target regulating curve.

Furthermore, the regulating and control unit can have an alternative learning functionality for generating a reference process progression, wherein the learning functionality is configured in such a way that, during its execution for carrying out a number of essentially identical process cycles corresponding to a target operation for the process cycle, respective target positions for the valve closure and/or respective control variables for actuating the peripheral unit are detected over at least one respective time interval of a respective process cycle. The recorded target positions and/or control variables can be stored as the reference process progression with reference to the respective time segments of the process cycle. The learning function is therefore not limited to the regulating cycle alone but can affect all control commands managed or issued by the regulating and control unit.

Here, the respective times for the output of control signals are particularly relevant. By learning the respective relative times, i.e. relative to a preceding control signal, an optimization of the process progression and thus a reduction of the process time can be achieved.

The reference regulating progression can be defined as a function of the target variable and a permissible duration for the execution of the regulating cycle, in particular the process cycle to be executed.

According to a specific embodiment, the regulating and control unit can be designed to output a start signal for actuating the peripheral unit and to initiate the regulating cycle with a defined time offset with respect to the start signal. This is advantageous, for example, if the peripheral unit is a more controllable gas inlet unit and is to start regulating the internal pressure at the beginning of the gas inlet. Unlike a prior art arrangement where a host controller outputs a gas inlet signal to the valve and the valve then expects a pressure sensor feedback signal, the timing of the regulation can be adjusted to start with the gas inlet. In particular, a targeted adjustment of the valve closure can take place in a first regulating phase and a pure regulation based on received pressure information can be used in the connection.

Due to the two-stage cycle, for example, the regulation starts with a certain time offset (generated by the previously running controlled adjustment of the valve closure and adapted to the start time), whereby current pressure data from the process volume are already available for the regulation and the regulation can thus start directly.

The process parameter can be embodied in particular by pressure information for the vacuum process volume. The target variable can be a target pressure to be reached in the vacuum process volume and the currently determined regulating variable can represent a current pressure in the vacuum process volume. This then concerns a pressure regulation for a process volume.

For example, in response to a measured pressure in a process chamber, an opening cross-section of the valve is adjusted in a certain direction, wherein a pressure drop is to be expected when the cross-section is increased and a pressure increase is to be expected when the cross-section is reduced (predictability). If the process structure is very well known, then in addition to the direction (increase and decrease in pressure) of the pressure change, an amount of the pressure change caused by this can also be at least roughly known.

In one variant of the invention, the target variable can be a target pressure to be achieved in the vacuum process volume, wherein the currently determined regulating variable—for example in addition to pressure information—indicates a current media inflow into the vacuum process volume, in particular wherein the currently determined regulating variable takes a current pressure inlet variable into account. With this additional information, the target pressure can be regulated with increased accuracy and efficiency.

In particular, outlet information can be stored or currently determined with the current determined regulating variable, wherein the outlet information specifies which mass or which volume of a medium (e.g. process gas) flows out of the process volume per time unit and as a function of the closure position. The outlet information can depend to a large extent on the suction power provided by a vacuum pump.

The regulating and control unit can, for example, be connected to a pressure sensor, wherein an output signal from the pressure sensor provides the currently determined regulating variable (current pressure in the process chamber). Alternatively or additionally, the regulating and control unit can be connected to a mass flow meter or a mass flow control unit and an output signal of the mass flow meter or the mass flow control unit provides the currently determined regulating variable (e.g. as information about an inflow quantity of a process gas per time). In the second case, the regulating variable does not have to be the chamber pressure, but can also represent the current gas inflow.

Preferably, the actual regulating curve and the reference regulating curve are recorded in the form of a respective regulating curve.

In one embodiment, the vacuum valve and the regulating and control unit are of integrated design.

Alternatively, the control and regulating unit may be structurally separate from the vacuum valve and in communication connection with the vacuum valve, in particular wherein there is a wireless radio link or a wired connection.

The peripheral unit can be designed in corresponding embodiments as
  a process gas supply unit, in particular as an evaporator, as a gas inlet valve or as a mass flow controller,
  a plasma generator, in particular high-frequency reverse-polarity electrodes, in particular with a frequency of at least 13 MHz,
  a vacuum transfer valve for loading and unloading the vacuum process volume,
  a temperature control unit for setting a defined temperature in the process chamber or on the object,
  a robot unit for transporting the object into and/or out of the vacuum process volume,
  a vacuum pump, or
  a pin lifting device, in particular a pin lifter, for providing the object in a working state, in particular a working position.

According to a specific embodiment, a defined quantity of gas can be made available for a process cycle in the vacuum process volume and thus the defined process state can be made available at least partially by actuating the peripheral unit designed as a process gas supply unit.

The invention also relates to a regulating and control unit for a vacuum process system, wherein the vacuum process system has at least one vacuum valve which is designed to regulate a volume or mass flow and/or to close a process volume (1) in a gas-tight manner and has a valve closure which can be adjusted by means of a drive unit, and also has a vacuum process volume which can be evacuated and into which the object can be introduced for the processing thereof, and a peripheral unit designed to at least partially provide a defined process state in the vacuum process volume. The vacuum valve, the peripheral unit and the vacuum volume can be designed as outlined herein.

The regulating and control unit is designed and configured for multiple execution of a process cycle. The process cycle comprises such actuation of the peripheral unit that at least part of the defined process state can be provided, and execution of a regulating cycle providing a specific variation or setting of the valve opening state by actuating the drive unit based on a currently determined regulating variable for a process parameter and based on a target variable, in particular as a result of which the regulating variable can be approximated to the target variable by a change in state of the valve closure brought about in this way. The actuation of the peripheral unit and the execution of the regulating cycle can be carried out within the framework of the process cycle with a certain time relation.

The regulating and control unit can be wired or wirelessly connected to the other controllable components of the system.

The regulating and control unit may also have an interface (logical and/or physical) for adapting or updating its software or algorithms and/or for reading protocol data.

The invention further relates to a method for performing a process cycle with a vacuum process system, wherein the vacuum process system comprises at least
  a vacuum valve which is designed for regulating a volume or mass flow and/or for the gas-tight closure of a process volume and has a valve closure which can be adjusted by means of a drive unit, a vacuum process volume which can be evacuated and into which the object can be introduced for processing, and a peripheral unit designed for at least partially providing a defined process state in the vacuum process volume.

Within the framework of the method, a process cycle is carried out, in particular several times. The process cycle shall include at least actuating the peripheral unit in such a way that at least part of the defined process state is provided, and execution of a regulating cycle providing a specific variation or setting of the valve opening state by actuating the drive unit based on a currently determined regulating variable for a process parameter and based on a target variable, in particular as a result of which the regulating variable can be approximated to the target variable by a change in state of the valve closure brought about in this way.

The actuation of the peripheral unit and the execution of the regulating cycle are carried out within the framework of the process cycle with a defined time relation.

The invention also relates to a computer program product which is stored on a machine-readable carrier, in particular in a regulating and control unit described above, with program code for the timed execution or control of at least the following steps of the above method:

actuation of the peripheral unit and execution of the regulating cycle with regulated variation or adjustment of the valve opening state.

In particular, the program or the program code is executed in an electronic data processing unit, in particular the regulating and control unit, the vacuum process system or in the regulating and control unit. This means that a (complete) process cycle can be controlled and regulated by executing a corresponding (computer-implemented) algorithm.

The device according to the invention and the method according to the invention are described in more detail below on the basis of concrete exemplary embodiments schematically depicted in the drawings, wherein further advantages of the invention are also discussed. The drawings show in detail:

Figure 1:
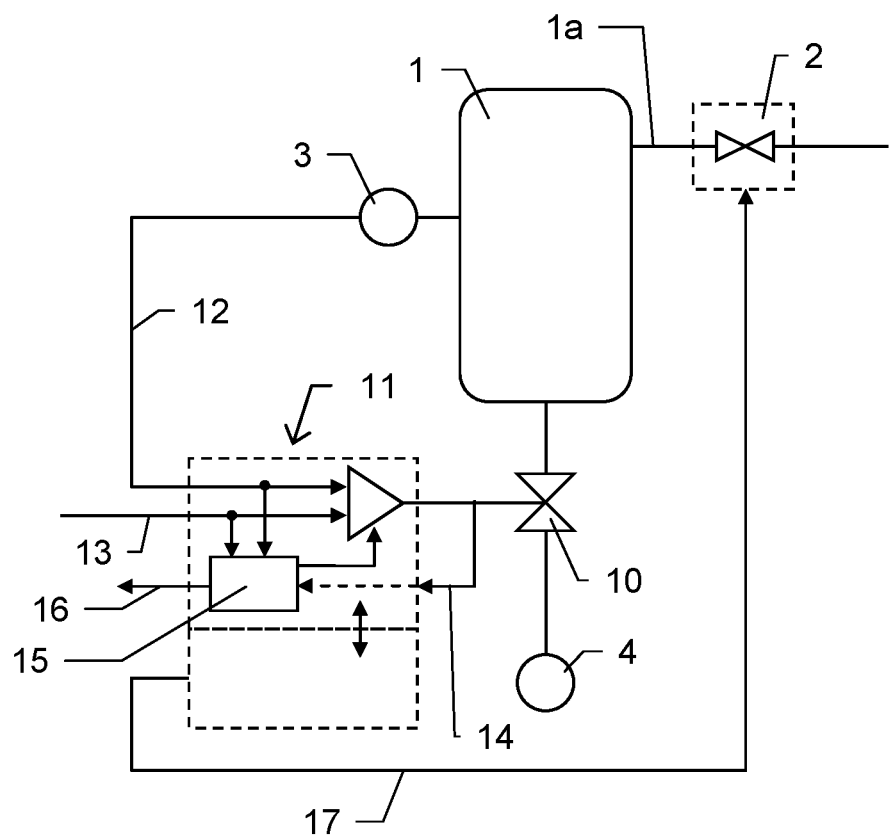
FIG. 1 shows a schematic representation of a first embodiment of a vacuum process system for the controlled-regulated operation of a process cycle according to the invention.

FIG. 1 schematically shows the structure of a system according to the invention for processing an object, e.g. a semiconductor wafer, under vacuum conditions. The structure has a vacuum process chamber 1 and a supply line 1a into the process chamber 1, wherein the supply line 1a is coupled with a peripheral unit 2, in this case a gas flow meter or regulator, and thus a quantity of gas flowing into the process chamber 1 can be measured or the inflowing quantity of gas can be regulated accordingly. A pressure sensor 3 is also provided, which allows the pressure inside the process volume 1 (chamber pressure) to be determined.

At one outlet side of process chamber 1 a vacuum pump 4 is connected to chamber 1 for its evacuation. Between vacuum pump 4 and chamber 1 there is an adjustable vacuum valve 10 for the control or regulation of the outflowing mass flow. The (controlled) adjustability can be realized by a motorized, pneumatic or hydraulic drive of the valve.

According to the invention, the system has a regulating and control unit 11, which on the one hand is connected to the peripheral unit 2 and enables direct actuation and adjustment of this unit and on the other hand is connected to the valve 10 and provides at least one controlled actuation of the valve 10 on the basis of a corresponding input variable 12 (regulating variable) and a target variable 13 (target value). To provide the input variable 12, the regulating and control unit 11 can receive a signal from the pressure sensor 2. The chamber pressure can therefore serve as a relevant process parameter to be regulated.

The regulating and control unit 11 is thus able to jointly control and regulate the main components of the system, the vacuum valve 11 and the gas inlet 2, which are intended for carrying out object processing. An advantage of this arrangement is that in the prior art typically given delays between a gas inlet, a pressure measurement and a regulation of the chamber pressure can be significantly reduced or completely avoided. These delays have so far been due to the fact that it was not the control or regulation of the valve that actively actuated the peripheral device 2, but the regulator of the valve typically received a start signal for the process start or gas inlet, resulting in a natural delay for the pressure regulation. Due to the ever further reduced process times for individual processing steps (sometimes in the millisecond range), an improvement associated with this invention with regard to the duration for setting the required process conditions (chamber pressure, temperature, plasma ignition, etc.) leads to a significant improvement in the overall processing time. The throughput of objects to be processed can be increased accordingly.

A process cycle that can be carried out with the system can be initiated by the regulating and control unit 11 in that this unit 11 transmits a signal 17 to the peripheral unit 2. The signal 17 can be, for example, in the form of a start signal for an action occurring in a predefined manner (e.g. variation of the inflowing gas quantity) of peripheral unit 2 or in the form of a continuously transmitted control variable for the equally continuous targeted actuation of peripheral unit 2. In other words, either a start signal alone can be output and the function of peripheral unit 2 can then run automatically, in a predefined manner, or the state of peripheral unit 2 (e.g. the inflowing gas quantity) is actively set by the regulating and control unit 11 over a certain period of time.

A predefined process cycle can thus be initiated by means of the regulating and control unit 11. A predetermined amount of a process gas can be introduced into chamber 1 or a predefined mass or volume flow through the chamber can be introduced.

Depending on the time of the cycle start or the control of peripheral unit 2, the regulation of the valve position can also be initiated by regulating and control unit 11. For this purpose, the regulating and control unit 11 receives a current pressure signal 12 from the pressure sensor 3. The regulation can be started with a defined time offset.

By knowing the point in time at which the process begins by actuating the peripheral unit 2, it is possible, for example, to carry out a controlled pre-regulation step at valve 10 in a timed manner—even without receiving the pressure signal 12. For example, the valve closure is specifically moved to a pre-regulating position that is known to be close to the expected initial regulating position. Following this controlled offset, it is then possible to transfer (switch over) to regulation based on the pressure signal 12.

An increase in speed also results from the naturally given signal delays (delay) for a pure prior art regulating system. For example, the pressure sensor 3 needs a certain amount of time to determine a current chamber pressure and for a corresponding signal generation and output. This means that the regulating system also receives the required regulating variable with this delay, which results in a similar delay for the regulation and the attainment of the desired target pressure. This signal delay can be bridged by pre-control of the valve.

By means of the pre-control, a first adjustment path for the valve closure can be run without a feedback signal (current pressure) and then be converted into a regulating step, i.e. a regulated movement of the valve closure. This allows the delay described above to be reduced or avoided, since the signal from the pressure sensor is already present at the start of the later regulating phase, for example, and can then be processed directly by the regulator.

Switching between the two steps can be done according to a predefined and known actuating behavior of peripheral unit 2 or valve 10. Since the changeover here takes place automatically after a specified time has elapsed, no further feedback signal is required.

In such an exemplary embodiment, the process cycle basically has three successive stages, as follows:

a) In a first stage—the active actuation of peripheral unit 2—the gas inlet is controlled.

b) In a second stage—a pre-regulating step—the valve closure is placed in this position on the basis of a known intermediate target position (pre-regulating position). The pre-regulating step is initiated or triggered by the start signal 17. The start signal 17 is generated by the regulating and control unit 11.

c) A transition from the pre-regulating step to a regulating step which forms the third stage of the process cycle takes place automatically when the pre-regulating position is reached or with a known time difference to the start signal. The reaching of the pre-regulating position can be detected, for example, by a currently and continuously determined closure position and a comparison of this position with the preset pre-regulating position. A correspondingly current closure position information 14 can be transmitted from the valve 10 or a valve actuator to the regulating and control unit 11. In particular, such information is transmitted to a regulating and optimization module 15 of the regulating and control unit 11 (indicated by the dotted extension of the logical arrow 14). As soon as the pre-regulating position is reached, the system switches from pre-regulating mode (control) to real regulating mode (regulating step).

It is understood that as an alternative—but also with timing—the second stage of the process for example can already take place before the first stage of the process. Furthermore, in an alternative embodiment, the process cycle can be carried out in two stages, wherein the pre-control of valve 10 can be omitted.

In the regulating step provided by the regulating and control unit 11, a current pressure signal 12 of the pressure sensor 3 is continuously received as input variable 12, i.e. as the currently determined regulating variable, whereby a current pressure state is known or provided in process chamber 1. The regulating and control unit 11 is also provided with a target pressure or a target pressure curve for a respective processing process as a setpoint or target variable 13. Based on these input variables, an actuating signal is generated with regulating and control unit 11 and output to the motorized valve 10.

To set a desired internal pressure in the process chamber 1, the valve opening of the vacuum valve 10 is thus varied within the framework of the regulating cycle in such a way that a gas outflow from the process chamber takes place in such a way that the current internal pressure can be approximated to a target pressure—in a first step by means of a controlled, one-off adjustment of the valve closure into the pre-regulating position and in a second step by means of a regulated variation of the closure position on the basis of the continuously detected regulating variable. In particular, an effect on the regulating variable caused by a defined position change of the valve closure can essentially be predicted, whereby a targeted and efficient regulation can be provided.

For example, the valve opening is to be set relatively wide open in a first time period of a processing process, so that the internal pressure is lowered as quickly as possible and the valve opening is set less wide open in the further course of the regulation, so that the desired internal pressure can be set and maintained in a later time period by a controlled outflow of a smaller quantity of gas per time unit, wherein in particular a laminar or molecular gas flow or also a mixed form of both is present. A regulating cycle with differently adapted parameters can be stored for both of these time periods, i.e. for each target pressure to be set.

By varying the valve position, i.e. the position of the valve closure relative to the valve opening, the pressure inside process chamber 1 is varied and thus a regulating profile, in particular a regulating curve, is defined for each regulating cycle, i.e. pressures and/or valve positions at respective times in a specific time interval. A processing process in a process chamber is typically repeated many times in process cycles (multiple execution also of the regulating curve or regulating cycle), wherein the pressure regulation is then to be carried out correspondingly cyclically in the same way.

The regulating and control unit 11 can also be used, for example, to control the loading of the process chamber with a workpiece to be processed, e.g. semiconductor wafers, and subsequently the creation of a defined atmosphere or the ignition of a plasma in the process chamber. For such a process atmosphere, a defined process gas is typically fed into the process chamber 10—in particular via the gas flow meter or regulator 2—and the internal pressure in the process chamber is brought to a predefined level by means of the vacuum suction and its regulation with the valve 10.

According to the invention, the regulating and control unit 11 can also be provided with update functionality. The update functionality can be carried out while the regulating cycle is running or at least during the regulating step. In this case, the received regulating variable 12 (e.g. signal of the pressure sensor) is recorded at least temporarily and an actual regulating curve is derived on the basis thereof. For example, a pressure curve and/or—if the closure position information 17 is received as part of the regulating variable—a closure position curve are derived, i.e. values for the internal chamber pressure and values for the closure position in relation to regulating times.

As part of an update of the regulating cycle using the update functionality, the recorded actual regulating curve can be compared with a reference regulating curve and a regulating deviation can be derived on this basis. The reference regulating curve can represent a regulating cycle or step that has been recorded in advance and, if necessary, executed specifically and under defined and controlled conditions. For example, the reference regulating curve is stored in the form of a target regulating curve.

Depending on a characteristic of the derived regulating deviation and based on the essentially predictable effect on the regulating variable 12, an adjustment, e.g. of the pre-regulating position or an adjustment of the actuation of peripheral unit 2, can then be carried out. In other words, the gas inlet, for example, can be readjusted in such a way that the actual regulating curve is approximated to the reference curve within the framework of the calculated deviation.

The regulating and control unit 11 can be configured in such a way that the update functionality is carried out continuously, in particular over a plurality of regulating cycles during a production process.

The system shown in FIG. 1 thus enables, on the one hand, a rapid adjustment of a desired pressure state in the process chamber 1 (by at least the two-stage nature of the overall controlled process cycle) and, in addition, a continuous adaptation of the regulating curve and/or of the actuation of a further process unit 2 (peripheral unit) in such a way that, for example, in the event of any occurring deviations from a desired regulation, the process cycle can be automatically corrected, e.g. by readjusting regulating parameters (e.g. pre-regulating position) or adapting the active actuation of the further process unit 2.

A verification or monitoring functionality may also be provided to verify process integrity and/or quality.

On the basis of the information about the reference curve of the regulation, a currently recorded regulating curve can now be compared with the nominal curve and, based on this comparison, information can be derived as to whether the regulation has been carried out within set limits, e.g. within a tolerance range, or not.

The regulating and control unit 11 can also have a learning function which can be used to generate information relating to an actuation of peripheral unit 2 or a reference regulation. For this purpose, a production cycle is carried out several times with set target conditions (e.g. target pressure, target temperature, pressure curve, temperature curve, etc.) and the pressure in chamber 1 is set in a regulated manner via the gas inlet 2 and the valve position to achieve the target pressure using the regulating and control unit 11. While passing through these production cycles, the states of the gas inlet 2 and in particular also the valve positions in the individual cycles are stored over the process time. A target process information combining the individual data records (one data record per process cycle) is then derived from the data quantity that can be generated in this way, e.g. by means of balancing calculations or modeling.

The regulating and control unit 11 also has an output channel 16, which can be used to output a signal that contains information about the current process status. For example, a user can recognize whether the process is running within its specified limits or whether there are deviations from them. Alternatively or in addition, the signal of a computer unit or superordinate process control unit can be provided, whereby automatic adjustments of an overall process can be made, for example. For example, a quantity of gas to be admitted or a chamber temperature can be varied controlled by the regulating and control unit 11.

Such a verification functionality thus makes it possible to check whether the boundary conditions defined for a process are adhered to. If, for example, a deviation between a currently recorded regulating curve and the target regulating curve stored for the process is detected, this deviation can be used, for example, to draw conclusions about the presence of a leak in the process chamber or a deviating gas injection.

It is understood that the peripheral unit 2, for example, is designed as an evaporation system with which a desired quantity of process gas can be generated and injected into the chamber. The gas application can, for example, be pulsed, i.e. one pulse for each process step or a stepwise pulsed increase of the gas quantity for a single process step.

Figure 2:
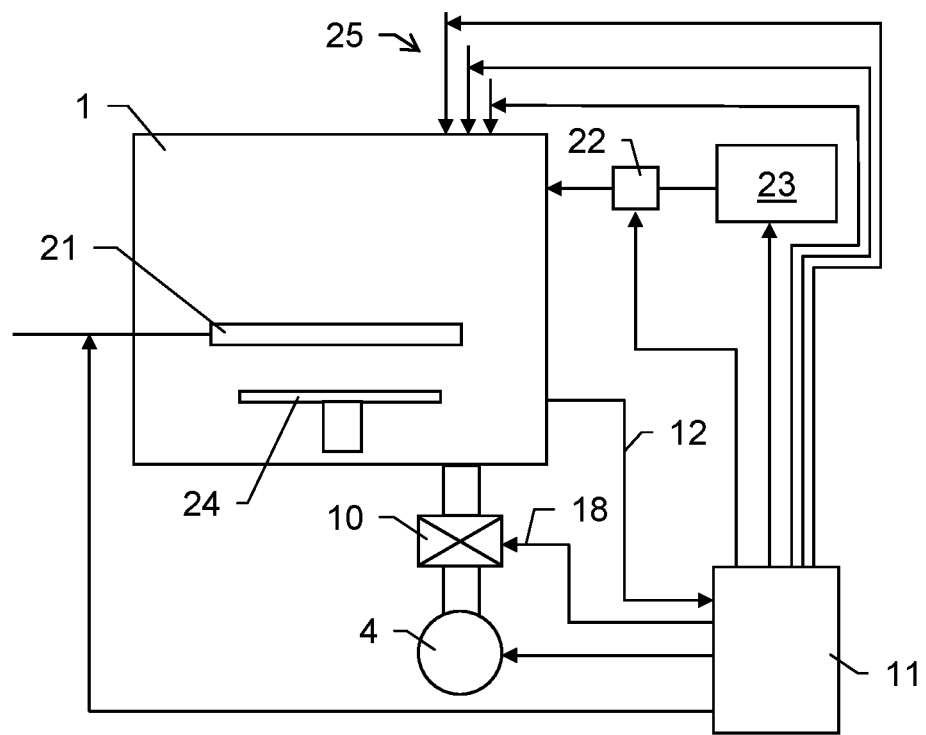
FIG. 2 shows another embodiment of a vacuum processing system according to the invention.

FIG. 2 shows another embodiment of a vacuum processing system according to the invention. A process chamber 1 is in turn connected to a vacuum pump 4 for this purpose, wherein the volume flow from chamber 1 which can be provided by the pump 4 is adjustable and/or variable by means of a vacuum control valve 10. A pressure signal 12 provides information on the state of the atmosphere in chamber 1.

A regulating and control unit 11 is designed such that the internal pressure in chamber 1 can be regulated on the basis of the pressure information 12 and by means of the adjustability of an opening cross-section of the valve 10. The valve 10 receives corresponding control signals 18 from the regulating and control unit 11. An actual state in chamber 1 (here: actual pressure) is approximated to a target state (here: predefined target pressure) by the regulation (here: specific gas discharge from chamber 1).

The system has further components that are intended for targeted processing of an object (e.g. semiconductor wafers). These peripheral units are embodied by an electrode arrangement 21 for generating a plasma in the process chamber 1, by a gasification and/or gas injection device 22 for providing a process gas or precursor gas (can be pulsed or operated as required) via a first gas supply line, by a liquid and/or precursor tank 23, by a temperature-controllable and/or adjustable receptacle 24 for the object and by further controllable gas supply lines 25.

The regulating and control unit 11 is connected to each of these peripheral units 21-25. The regulating and control unit 11 is also designed to actuate each of these units 21-25 in a targeted manner according to a predefined process cycle and thus to run the processing process according to a (defined) formula. As a result of this bundled actuation and regulation of the process cycle an advantageous process speed can be reached. Since the main steps of the process are all controlled and carried out on a common basis, an optimization regarding potential delays between individual steps can be realized.

In particular, individual sub-processes such as filling the chamber with a defined process gas (by means of the gas supply units 22, 23), setting a defined process pressure (by means of the valve regulation) and generating a plasma (by means of the electrodes 21) at a specific pressure can be carried out in a time-coordinated and adjusted manner. This allows a reduction of the processing time compared to such prior art processes.

In a further embodiment (only partially represented), the regulating and control unit 11 is designed to receive further process information from at least one of the peripheral units. In this case, information (e.g. status information and control information) can be transmitted bidirectionally. In other words, for example, information relating to the pump line can be acquired from vacuum pump 4 or information relating to the gas flow can be acquired from gasification and/or gas injection device 22 and this information can be processed to control or regulate the vacuum valve, one of the controllable gas supply lines 25 (e.g. MFC—Mass Flow Controller, mass flow meter) or the gas injection device 22 itself.

The regulating and control unit 11 may itself be implemented as part of the gasification and/or gas injection device 22.

Figure 3A:
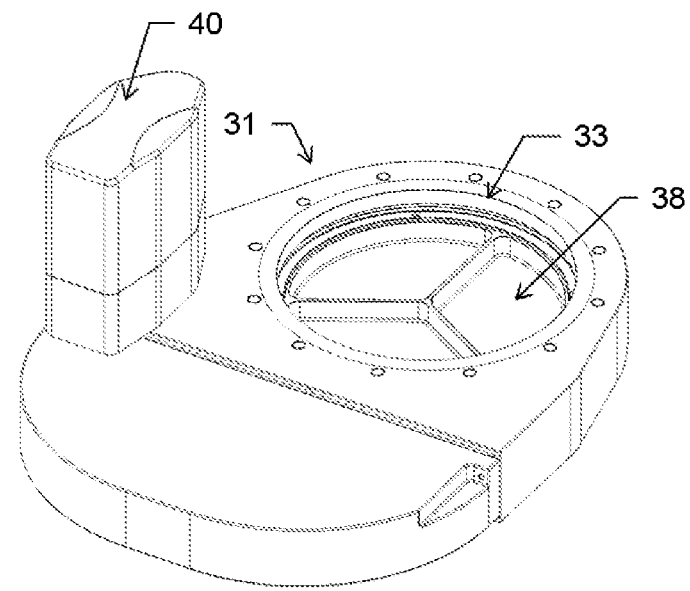
FIGS. 3a-c show an embodiment of a vacuum valve that can be regulated and is provided according to the invention as a pendulum valve.
Figure 3B:
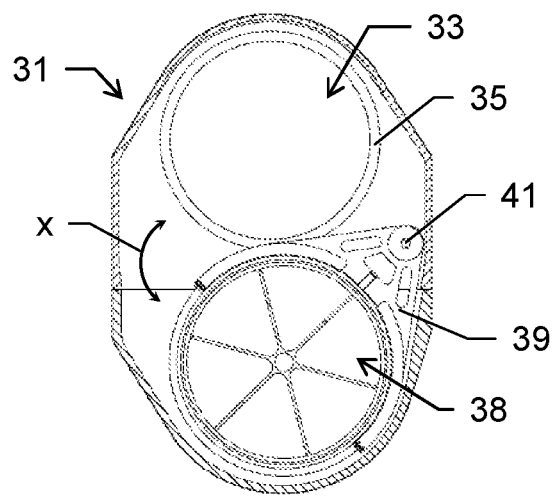
Figure 3C:
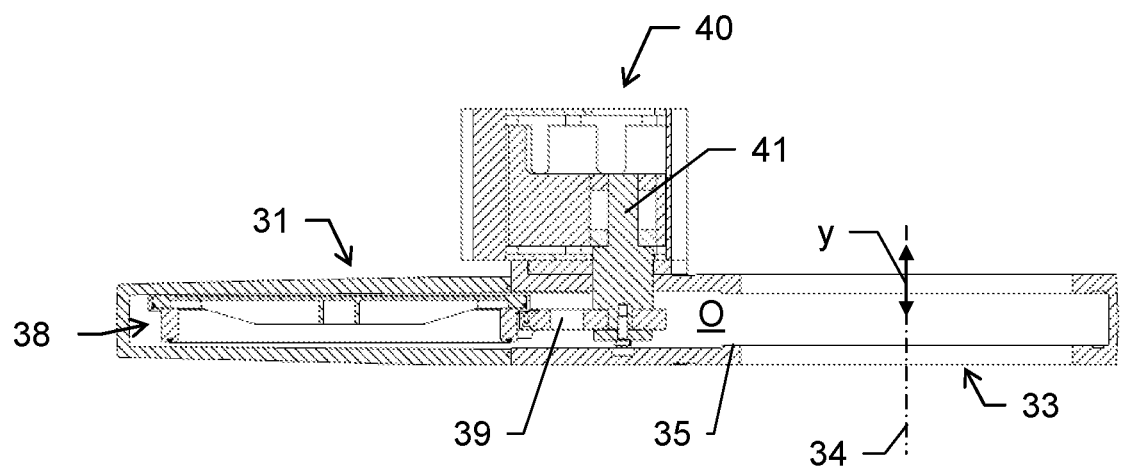

FIGS. 3a to 3c show a possible embodiment of a vacuum valve in the form of a pendulum valve as part of a processing system according to the invention. The valve for the essentially gas-tight interruption of a flow path has a valve housing 31, which has an opening 33. The opening has a circular cross-section. In a closed position of the valve disk 38 (valve closure), the opening 33 is closed gas-tight by means of the valve disk 38. An open position O of the valve disk 38 is illustrated in FIGS. 3b and 3c.

The opening 33 is enclosed by a valve seat. This valve seat is formed by a sealing surface 35 which points axially in the direction of the valve disk 38, runs transversely to the opening axis 34, has the shape of a circular ring and is formed in the valve housing 31.

In addition, the valve has a pivotable valve disk 38 which can be adjusted essentially parallel to the opening axis 34.

The valve disk 38 is connected to an electric drive 40 (motor) via an arm 39 arranged on the side of the disk and extending perpendicularly to the opening axis 34. In the closed position of the valve disk 38, this arm 39 is located outside the opening cross-section of opening 33 geometrically projected along the opening axis 34.

An electric drive 40 is designed by using a corresponding gear in such a way that the valve disk 38—as is usual with a pendulum valve—can be pivoted transversely to the opening axis 34 and substantially parallel over the cross-section of the opening 33 and perpendicular to the opening axis 34 by means of a transverse movement x of the drive 40 about a pivot axis 41 between an open position O and an intermediate position and can be displaced linearly by means of a longitudinal movement y of the drive 40 taking place parallel to the opening axis 34. In the open position O, the valve disk 38 is positioned in a dwell section located laterally adjacent to the first opening 33 so that the opening 33 and the flow path are released. In the intermediate position, the valve disk 38 is positioned at a distance above the first opening 33 and covers the opening cross-section of opening 33. In the closed position, opening 33 is closed gas-tight and the flow path is interrupted in that there is a gas-tight contact between the valve closure 38 (valve disk) and the sealing surface 35 of the valve seat.

In order to enable automated and regulated opening and closing of the valve, the valve is provided with an electronic regulating and control unit which is designed and connected to the drive 40 in such a way that the valve disk 38 can be adjusted accordingly for gas-tight closing of a process volume or for regulating an internal pressure of this volume. Together with the valve, a process volume and a peripheral unit, such a control unit forms a valve system according to the invention.

The position of the valve disk 38 is variably adjusted on the basis of a regulating variable and an output control signal. Information, e.g. on the current pressure state in the process volume connected to the valve, is obtained as input signal. In addition, the regulator can be provided with a further input variable, e.g. a mass flow into the volume. On the basis of these variables and on the basis of a specified target pressure that is to be set or reached for the volume, the valve is then set in a regulated manner over the time period of a regulating cycle, so that a mass outflow from the volume can be regulated over time by means of the valve. A vacuum pump is typically provided behind the valve for this purpose, i.e. the valve is arranged between the process chamber and the pump. Thus a desired pressure curve can be adjusted.

By setting the valve closure 38, a respective opening cross-section is set for the valve opening 33 and thus the possible amount of gas that can be evacuated from the process volume per time unit is set. For this purpose, the valve closure 38 may have a shape deviating from a circular shape, particularly in order to achieve a media flow that is as laminar as possible.

To set the opening cross section, the valve disk 38 can be adjusted by the regulating and control unit from the open position O to the intermediate position by means of the transverse movement x of the drive 40 and from the intermediate position to the closed position by means of the longitudinal movement y of the drive 40. To fully open the flow path, the valve disk 38 can be moved by the control system from the closed position to the intermediate position by the longitudinal movement y of the drive 40 and from there from the intermediate position to the open position O by the transverse movement x of the drive 40.

In the present embodiment, the drive 40 is designed as an electric motor, wherein the gear can be switched over in such a way that driving the drive 40 causes either the transverse movement x or the longitudinal movement y. The drive 40 and the gear are electronically actuated by the regulating system. Such gears, in particular with splitter gearshifts, are known from the prior art. Furthermore, it is possible to use several drives to effect the transverse movement x and the longitudinal movement y, wherein the control system assumes actuation of the drives.

The precise regulation or adjustment of the flow rate with the pendulum valve described above is not only possible by pivoting adjustment of the valve disk 38 between the open position O and the intermediate position by means of the transverse movement x, but above all by linear adjustment of the valve disk 38 along the opening axis 34 between the intermediate position, the closed position by means of the longitudinal movement y. The pendulum valve described can be used for precise regulating tasks.

Both the valve disk 38 and the valve seat each have a sealing surface 35—a first and a second sealing surface. The first sealing surface 35 also has a seal. This seal can, for example, be vulcanized onto the valve seat as a polymer by means of vulcanization. Alternatively, the seal can be designed as an O-ring in a groove of the valve seat, for example. A sealing material can also be bonded to the valve seat and thus embody the seal. In an alternative embodiment, the seal can be arranged on the side of the valve disk 38, especially on the second sealing surface. Combinations of these embodiments are also conceivable.

As an alternative to a pendulum valve as shown, the vacuum process system according to the invention can be realized with another type of vacuum valve, e.g. a flap valve, slide valve or a so-called butterfly regulating valve. In particular, the system is designed with pressure regulating valves for use in the vacuum area. In addition, pendulum valves can also be used, the closure of which can only be adjusted in one direction.

The regulating and control unit can, for example, be of integrated design with the vacuum valve, i.e. the regulating and control unit is provided by and with the valve and the other peripheral devices which are to be actuated by the regulating and control unit are connected to the valve or its regulating and control unit.

It is understood that the figures shown only schematically represent possible exemplary embodiments. The different approaches can be combined with each other according to the invention as well as with methods and devices for pressure regulation or control for and of vacuum processes of the prior art.

The invention claimed is:

1. A vacuum process system for a defined processing of an object, at least comprising:
   a vacuum process volume which can be evacuated and into which the object can be introduced for the processing thereof;
   a vacuum valve for regulating a volume or mass flow from the vacuum process volume and/or for a gas-tight closure of the vacuum process volume;

a peripheral unit designed for at least partially providing a defined process state in the vacuum process volume; and a regulating and control unit, wherein the vacuum valve comprises a valve seat having a valve opening defining an opening axis and a first sealing surface surrounding the valve opening;

a valve closure for substantially gas-tight closing of the valve opening with a second sealing surface corresponding to the first sealing surface; and a drive unit coupled to the valve closure and configured such that the valve closure is variable and adjustable in a defined manner to provide a respective valve opening state, and is adjustable from an open position, in which the valve closure at least partially opens the valve opening, to a closed position, in which the first sealing surface is pressed against the second sealing surface and closes the valve opening substantially gas-tight, and back, wherein the regulating and control unit is designed for multiple execution of a process cycle, having an actuation of the peripheral unit that at least part of the defined process state can be made available, and an execution of a regulating cycle providing a specific variation or setting of the valve opening state by actuating the drive unit based on a currently determined regulating variable for a process parameter and based on a target variable, wherein the actuation of the peripheral unit and the execution of the regulating cycle can be carried out within a framework of the process cycle with a specific temporal relation, and wherein the peripheral unit is designed as a process gas supply unit, a plasma generator, a vacuum transfer valve for charging and/or discharging the vacuum process volume, a temperature control unit for setting a defined temperature in the vacuum process volume or on the object, a vacuum pump, a robot unit for transporting the object into and/or out of the vacuum process volume, or a pin lifting device for providing the object in a processing state.

2. The vacuum process system according to claim 1, wherein the regulating and control unit is designed for multiple execution of the process cycle, comprising:

an execution of a peripheral unit regulating cycle providing a targeted variation or setting of the peripheral unit by said actuation of the peripheral unit based on a currently determined peripheral unit regulating variable for a peripheral unit process parameter and based on a peripheral unit target variable, and wherein the execution of the regulating cycle and the execution of the peripheral unit regulating cycle can be carried out within the framework of the process cycle with a specific temporal relation.

3. The vacuum process system according to claim 2, wherein one or more peripheral unit process parameters can be taken into account in the regulating cycle, and/or wherein one or more process parameters can be taken into account in the peripheral unit regulating cycle.

4. The vacuum process system according to claim 1, wherein the regulating and control unit is comprised by the vacuum valve or the peripheral unit.

5. The vacuum process system according to claim 1, wherein the peripheral unit has a peripheral unit control unit, and wherein the peripheral unit control unit is formed such that the regulating and control unit is embodied by the peripheral unit control unit.

6. The vacuum process system according to claim 1, wherein the regulating and control unit has an update functionality, which is configured in such a way that during its execution, process information is derived during a first process cycle, and a subsequent second process cycle is adapted based on the process information.

7. The vacuum process system according to claim 6, wherein by detecting the regulating variable during execution of the first process cycle, an actual regulating curve is derived as the process information, the actual regulating curve is compared with a stored reference regulating curve and a regulating deviation is derived, and the second process cycle is adjusted based on a characteristic value of the derived regulating deviation.

8. The vacuum process system according to claim 7, wherein the regulating and control unit is designed in such a way that the reference regulating curve can be generated and stored by recording regulating variables during the execution of a plurality of regulating cycles, wherein the regulating variables recorded for a specific time interval or for a specific time point of the regulating cycles are averaged.

9. The vacuum process system according to claim 1, wherein process information is derived by recording the regulating variable during execution of a first process cycle, and the actuation of the peripheral unit is adapted for a second process cycle based on the process information.

10. The vacuum process system according to claim 1, wherein the regulating and control unit has a learning functionality for generating a reference process curve, wherein the learning functionality is configured in such a way that during its execution, for an execution of a number of essentially similar process cycles corresponding to a target operation for the process cycle, respective target positions for the valve closure and/or respective control variables for actuating the peripheral unit are recorded over at least one time segment of a respective process cycle, and the recorded target positions and/or control variables are stored as the reference process curve with reference to the respective time segments of the process cycle.

11. The vacuum process system according to claim 1, wherein the regulating and control unit is designed for outputting a start signal for actuating the peripheral unit, and for initiating the regulating cycle with a defined time offset with respect to the start signal.

12. The vacuum process system according to claim 1, wherein
the process parameter is embodied by pressure information for the vacuum process volume,
the target variable is a target pressure to be achieved in the vacuum process volume, and
the currently determined regulating variable represents a current pressure in the vacuum process volume.

13. The vacuum process system according to claim 1, wherein
the target variable is a target pressure to be achieved in the vacuum process volume, and
the currently determined regulating variable indicates a current media inflow into the vacuum process volume.

14. The vacuum process system according to claim 1, wherein
wherein a defined quantity of gas can be made available for a process cycle in the vacuum process volume by actuating the peripheral unit designed as a process gas supply unit, and thus the defined process state can be made available at least partially.

15. The vacuum process system according to claim 1, wherein
the regulating and control unit is connected
to a pressure sensor and an output signal of the pressure sensor provides the currently determined regulating variable, and/or
to a mass flow meter or a mass flow control unit and an output signal of the mass flow meter or the mass flow control unit provides the currently determined regulating variable.

16. A regulating and control unit for a vacuum process system, wherein the vacuum process system comprises at least:
a vacuum process volume which can be evacuated and into which an object can be introduced for processing thereof;
a vacuum valve which is designed to regulate a volume or mass flow and/or to close the vacuum process volume in a gas-tight manner and has a valve closure which can be adjusted by means of a drive unit; and
a peripheral unit designed for at least partially providing a defined process state in the vacuum process volume,
wherein the regulating and control unit is designed and configured for multiple execution of a process cycle, having
an actuation of the peripheral unit that at least part of the defined process state can be made available, and
an execution of a regulating cycle providing a specific variation or setting of a valve opening state by actuating the drive unit based on a currently determined regulating variable for a process parameter and based on a target variable,
wherein the actuation of the peripheral unit and the execution of the regulating cycle can be carried out within a framework of the process cycle with a specific temporal relation, and
wherein the peripheral unit is designed as
a process gas supply unit,
a plasma generator,
a vacuum transfer valve for charging and/or discharging the vacuum process volume,
a temperature control unit for setting a defined temperature in the vacuum process volume or on the object,
a vacuum pump,
a robot unit for transporting the object into and/or out of the vacuum process volume, or
a pin lifting device for providing the object in a processing state.

17. The regulating and control unit according to claim 16, designed for multiple execution of the process cycle, having
an execution of a peripheral unit regulating cycle providing a targeted variation or setting of the peripheral unit by said actuation of the peripheral unit based on a currently determined peripheral unit regulating variable for a peripheral unit process parameter and based on a peripheral unit target variable,
wherein the execution of the regulating cycle and the execution of the peripheral unit regulating cycle can be carried out within the framework of the process cycle with a specific temporal relation.

18. The regulating and control unit according to claim 17, wherein one or more peripheral unit process parameters can be taken into account in the regulating cycle, and/or
wherein one or more process parameters can be taken into account in the peripheral unit regulating cycle.

19. The regulating and control unit according to claim 16, wherein the regulating and control unit is comprised by the vacuum valve or the peripheral unit.

20. The regulating and control unit according to claim 16, wherein the peripheral unit has a peripheral unit control unit, and
wherein the peripheral unit control unit is arranged such that the regulating and control unit is embodied by the peripheral unit control unit.

21. A method for carrying out a process cycle with a vacuum process system, wherein the vacuum process system comprises at least:
a vacuum process volume which can be evacuated and into which an object can be introduced for processing thereof;
a vacuum valve which is designed to regulate a volume or mass flow and/or to close the vacuum process volume in a gas-tight manner and has a valve closure which can be adjusted by means of a drive unit; and
a peripheral unit designed for at least partially providing a defined process state in the vacuum process volume,
wherein the method comprises carrying out the process cycle within a framework of the process cycle, and the process cycle comprises at least:
actuating the peripheral unit in such a way that at least a part of the defined process state is provided; and
executing a regulating cycle providing a specific variation or setting of a valve opening state, including actuating the drive unit based on a currently determined regulating variable for a process parameter and based on a target variable,
wherein the actuation of the peripheral unit and the execution of the regulating cycle are carried out within the framework of the process cycle with a specific temporal relation, and
wherein the peripheral unit is designed as
a process gas supply unit,
a plasma generator,
a vacuum transfer valve for charging and/or discharging the vacuum process volume,
a temperature control unit for setting a defined temperature in the vacuum process volume or on the object,
a vacuum pump,
a robot unit for transporting the object into and/or out of the vacuum process volume, or a pin lifting device for providing the object in a processing state.

22. A non-transitory computer-readable storage medium storing computer program instructions that, when being executed by a regulating and control unit of the vacuum process system of claim 21, cause the vacuum process system to perform the method according to claim 21.

* * * * *